US012386405B2

(12) United States Patent
Shankar et al.

(10) Patent No.: US 12,386,405 B2
(45) Date of Patent: Aug. 12, 2025

(54) SPLIT RAIL POWER SUPPLY ARCHITECTURE

(71) Applicant: TEXAS INSTRUMENTS INCORPORATED, Dallas, TX (US)

(72) Inventors: Ruchi Shankar, Bengaluru (IN); Robin O. Hoel, Olso (NO); Patrick Seem, Oslo (NO); Oddgeir Fikstvedt, Oslo (NO); Jan-Tore Marienborg, Oslo (NO)

(73) Assignee: Texas Instruments Incorporated, Dallas, TX (US)

( * ) Notice: Subject to any disclaimer, the term of this patent is extended or adjusted under 35 U.S.C. 154(b) by 120 days.

(21) Appl. No.: 18/498,757

(22) Filed: Oct. 31, 2023

(65) Prior Publication Data

US 2025/0076945 A1  Mar. 6, 2025

(30) Foreign Application Priority Data

Sep. 5, 2023  (IN) .............................. 202341059467

(51) Int. Cl.
*G06F 1/00* (2006.01)
*G06F 1/26* (2006.01)
*G06F 1/3203* (2019.01)
*H03K 3/356* (2006.01)
*H03K 19/0185* (2006.01)
*G06F 1/3296* (2019.01)

(52) U.S. Cl.
CPC ............ *G06F 1/263* (2013.01); *G06F 1/3203* (2013.01); *H03K 3/356113* (2013.01); *H03K 19/018521* (2013.01); *G06F 1/3296* (2013.01)

(58) Field of Classification Search
CPC . G06F 1/263; G06F 1/3203; H03K 3/356113; H03K 19/018521
USPC .......................................................... 713/300
See application file for complete search history.

(56) References Cited

U.S. PATENT DOCUMENTS

| 8,928,382 | B1 * | 1/2015 | Ler | ................... | H10D 30/6215 |
| | | | | | 327/237 |
| 10,284,187 | B1 * | 5/2019 | K | .......................... | H03M 3/458 |
| 10,447,153 | B2 * | 10/2019 | Raimar | ................... | H02M 3/07 |
| 10,965,278 | B1 * | 3/2021 | Narawade | ...... | H03K 19/018521 |
| 11,469,769 | B1 * | 10/2022 | Tanguay | ........... | H04L 12/40052 |

(Continued)

*Primary Examiner* — Volvick Derose
(74) *Attorney, Agent, or Firm* — Michelle F. Murray; Frank D. Cimino (57) ABSTRACT

Embodiments disclosed herein relate to split rail architecture for power supplies in a system, and more particularly, to providing isolation and control of a power supply. In an example, an integrated circuit device is provided that includes a device voltage supply, an input/output (I/O) voltage supply coupled to the device voltage supply, and a level shifter circuit coupled to the I/O voltage supply. The level shifter circuit includes a pair of cross-coupled p-type metal-oxide semiconductor field effect transistors (PMOS transistors), a pair of n-type transistors (NMOS transistors) coupled between the pair of cross-coupled PMOS transistors and a ground connection, and an inverter circuit coupled to the device voltage supply and the level shifter circuit. The level shifter circuit further includes a capacitor coupled to the pair of cross-coupled PMOS transistors and the ground connection and is in parallel with respect to a first one of the pair of NMOS transistors.

20 Claims, 5 Drawing Sheets

(56) References Cited

U.S. PATENT DOCUMENTS

| | | | |
|---|---|---|---|
| 2007/0170465 A1* | 7/2007 | Kwon | H03K 19/018528 |
| | | | 257/197 |
| 2008/0297267 A1* | 12/2008 | Thaller | H03B 5/1293 |
| | | | 331/117 R |
| 2014/0253201 A1* | 9/2014 | Jung | H03K 3/356104 |
| | | | 327/291 |
| 2017/0272075 A1* | 9/2017 | Chen | H03K 19/018521 |
| 2022/0103170 A1* | 3/2022 | Liberti | H03K 17/567 |
| 2023/0016895 A1* | 1/2023 | Ma | G06F 30/392 |

* cited by examiner

SPLIT RAIL POWER SUPPLY ARCHITECTURE

CROSS-REFERENCE TO RELATED APPLICATIONS

This application claims priority to and the benefit of India Provisional Patent Application No. 202341059467 entitled "Solving Split Rail Architecture Challenges," filed Sep. 5, 2023, which is incorporated by reference herein in its entirety.

TECHNICAL FIELD

This relates generally to split rail architecture for power supplies of a system.

BACKGROUND

In electronic systems including multiple power supplies and multiple components that may use different ones of the power supplies, split rail supply techniques may be used to control the power provided to each component at different times. For example, in applications where integrated circuits interface with other peripherals and devices that use multiple power supplies, split rail supply techniques may be included to perform regulator selection and sequencing for the power supplies.

In existing solutions, split rail support may be provided by including multiple instances or logic of power management unit (PMU) circuitry, such as power-on reset circuitry, brown-out detector circuitry, and bandgap circuitry, for each power supply. In this way, each power supply can be ramped up or down safely without causing issues to coupled components. However, such solutions add cost, power, and design area requirements to a system given the use of additional analog PMU circuitry and/or other hardware components.

In other existing solutions, split rail support may be provided via external power management circuitry, such as daisy-chained low-dropout regulators (LDOs), that can control power switches on input/output pins of a system. These systems may require a dedicated GPIO pin to drive power status indications to the external power management circuitry to ensure proper switching on and off of different power supplies. Despite providing effective power control, such solutions also increase cost, power, and physical area requirements due to higher pin counts and external components.

SUMMARY

Various embodiments disclosed herein relate to split rail architecture for power supplies in a system, and more particularly, to providing isolation and control of a power supply via power management circuitry. In an example, an integrated circuit device is provided that includes a device voltage supply, an input/output (I/O) voltage supply coupled to the device voltage supply, and a level shifter circuit coupled to the I/O voltage supply. The level shifter circuit includes a pair of cross-coupled p-type metal-oxide semiconductor field effect transistors (PMOS transistors), a pair of n-type transistors (NMOS transistors) coupled between the pair of cross-coupled PMOS transistors and a ground connection, and an inverter circuit coupled to the device voltage supply and the level shifter circuit. The level shifter circuit further includes a capacitor coupled to the pair of cross-coupled PMOS transistors and the ground connection and is in parallel with respect to a first one of the pair of NMOS transistors.

This Summary is provided to introduce a selection of concepts in a simplified form that are further described below in the Detailed Description. It may be understood that this Summary is not intended to identify key features or essential features of the claimed subject matter, nor is it intended to be used to limit the scope of the claimed subject matter.

BRIEF DESCRIPTION OF THE DRAWINGS

The drawings are not necessarily drawn to scale. In the drawings, like reference numerals designate corresponding parts throughout the several views. In some embodiments, components or operations may be separated into different blocks or may be combined into a single block.

DETAILED DESCRIPTION

Embodiments of the present disclosure are described in specific contexts, such as in microcontroller units (MCUs) and embedded systems or systems-on-chip. Some embodiments may use other circuits, components, architectures, topologies, and applications that exhibit increased power supply control when using split rail supplies.

Discussed herein are enhanced components, techniques, and systems related to split rail power supplies for providing isolation and control of a power supply via power management circuitry. In an electronic system, multiple power supplies may be included to power different components at varying voltages and times. Importantly, isolating and controlling power supplies across power domains can prevent coupled loads (e.g., peripheral devices) from functioning before intended times. To do so, level shifter circuits can be implemented to control logical states of the power supplies based on various inputs. For example, in a system including two power supplies that operate at different times and produce different voltages, level shifter circuitry can control start-up sequencing of the power supplies such that one of the power supplies does not produce erroneous voltages until the other power supply is on and stabilized. For example, a power management circuit may coordinate a power transition (e.g., power-on, reset, etc.) by waiting until a first power supply is stable before allowing circuitry powered by a second power supply to function. As the power supplies may operate at different voltages, the power management circuit may include one or more level shifters to convert these signals and others provided by circuitry powered by the first power supply to a suitable voltage for circuitry powered by the second power supply.

Various example systems employ split rail support circuits that can isolate and stabilize outputs of a power supply in a system. Some examples may utilize additional power management unit (PMU) circuitry, such as power-on reset circuitry, brown-out detector circuitry, and bandgap circuitry, for each power supply. In this way, each power supply can be ramped up or down safely without causing issues to coupled components. Other examples may include daisy-chained low-dropout regulators (LDOs) that can control power switches on input/output pins of a system. Problematically, however, both examples include additional circuitry that may not only increase cost and design area of a system-on-chip but also increase latency and power consumption in a system as additional analog PMU circuitry is required based on the increase in hardware components.

Some examples of the present disclosure include a unique level shifter topology that utilizes a capacitor coupled among a pair of cross-coupled p-channel metal-oxide semiconductor field effect transistors (also referred to as PMOS transistors) and a pair of n-channel MOSFETs (also referred to as NMOS transistors). The capacitor may increase the time that a node in the level shifter holds a certain logical state until the circuit can stabilize or until a control power supply can turn on and monitor another power supply coupled to the level shifter. Advantageously, such a topology can reduce latency within an embedded system, increase isolation between the two power supplies, stabilize output values of a power supply, and reduce design cost and area requirements by alleviating the need for additional PMU circuitry, among other benefits. Further, the described topology can reduce power consumption of a system, or components thereof, as split rail support elements of the topology may be turned off or powered down following resolution of logical states during operation.

In an example embodiment, an integrated circuit device is provided that includes a device voltage supply, an input/output (I/O) voltage supply coupled to the device voltage supply, and a level shifter circuit coupled to the I/O voltage supply. The level shifter circuit includes a pair of cross-coupled p-type metal-oxide semiconductor field effect transistors (PMOS transistors), a pair of n-type transistors (NMOS transistors) coupled between the pair of cross-coupled PMOS transistors and a ground connection, and an inverter circuit coupled to the device voltage supply and the level shifter circuit. The level shifter circuit further includes a capacitor coupled to the pair of cross-coupled PMOS transistors and the ground connection and is in parallel with respect to a first one of the pair of NMOS transistors.

In another example embodiment, a level shifter circuit is provided. The level shifter circuit includes an input, a first transistor coupled between a first power supply node and a first node, a second transistor coupled between the first node and a ground node, a third transistor coupled between a second power supply node and a second node, a fourth transistor coupled between the second node and the ground node, a capacitor coupled between the second node and the ground node, a fifth transistor coupled between the second power supply node and the third node, and a sixth transistor coupled between the third node and the ground node. The first transistor includes a gate coupled to the input. The second transistor includes a gate coupled to the input. The third transistor includes a gate coupled to a third node. The fourth transistor include a gate coupled to the first node. The fifth transistor includes a gate coupled to the second node. The sixth transistor includes a gate coupled to the input.

In yet another example embodiment, a system is provided that includes a processor, a memory coupled to the processor, and power management circuitry coupled to the processor. The power management circuitry includes a first voltage supply, a second voltage supply coupled to the first voltage supply, and a level shifter circuit coupled to the second voltage supply. The level shifter circuit includes a pair of cross-coupled p-type metal-oxide semiconductor field effect transistors (PMOS transistors), a pair of n-type transistors (NMOS transistors) coupled between the pair of cross-coupled PMOS transistors and a ground connection, and an inverter circuit coupled to the first voltage supply and the level shifter circuit. The level shifter circuit further includes a capacitor coupled to the pair of cross-coupled PMOS transistors and the ground connection and is in parallel with respect to a first one of the pair of NMOS transistors.

Figure 1A:
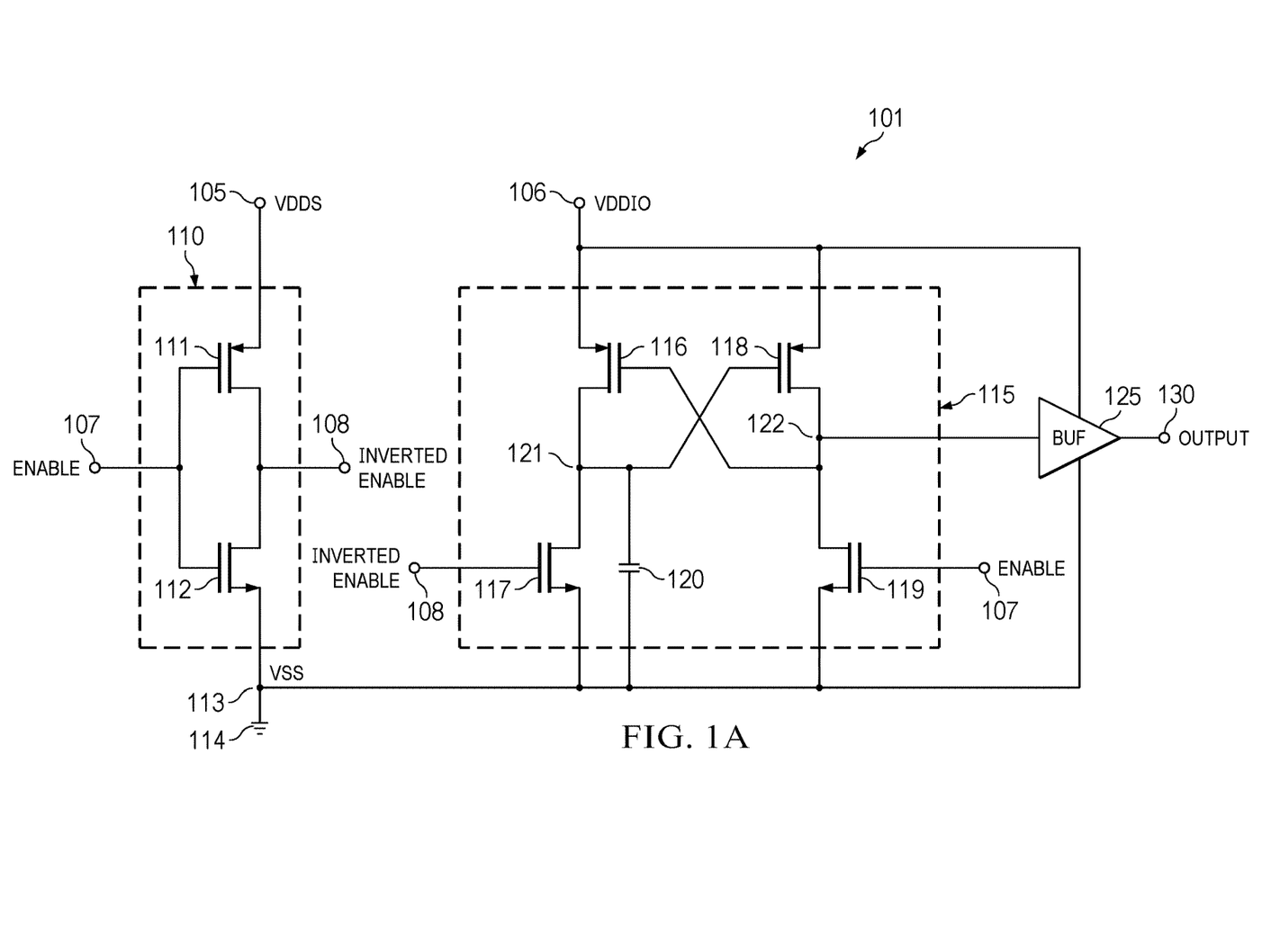
FIGS. 1A and 1B illustrate example circuit architectures that may be used in accordance with an embodiment.
Figure 1B:
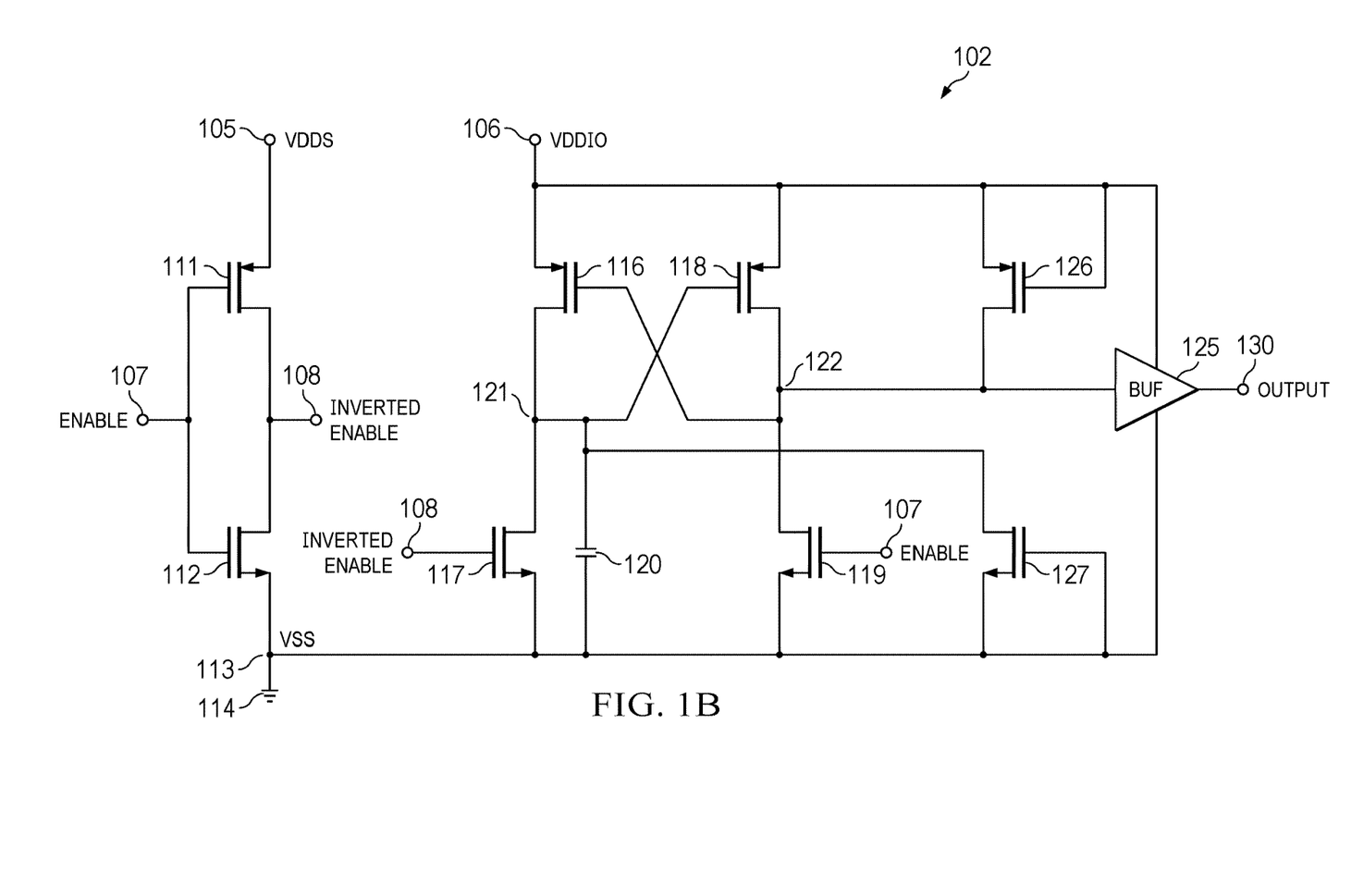

FIGS. 1A and 1B illustrate example circuit architectures that may be used in accordance with an embodiment. FIGS. 1A and 1B include circuit architectures 101 and 102, respectively, which include various components capable of providing split rail power supply support for power supplies in a system, such as VDDS 105 and VDDIO 106. Circuit architecture 101 includes inverter 110, level shifter 115, and buffer 125. Inverter 110 includes transistors 111 and 112. Level shifter 115 includes transistors 116, 117, 118, and 119. Circuit architecture 102 also includes inverter 110, level shifter 115, and buffer 125, and also includes clamp diodes 126 and 127.

Figure 3:
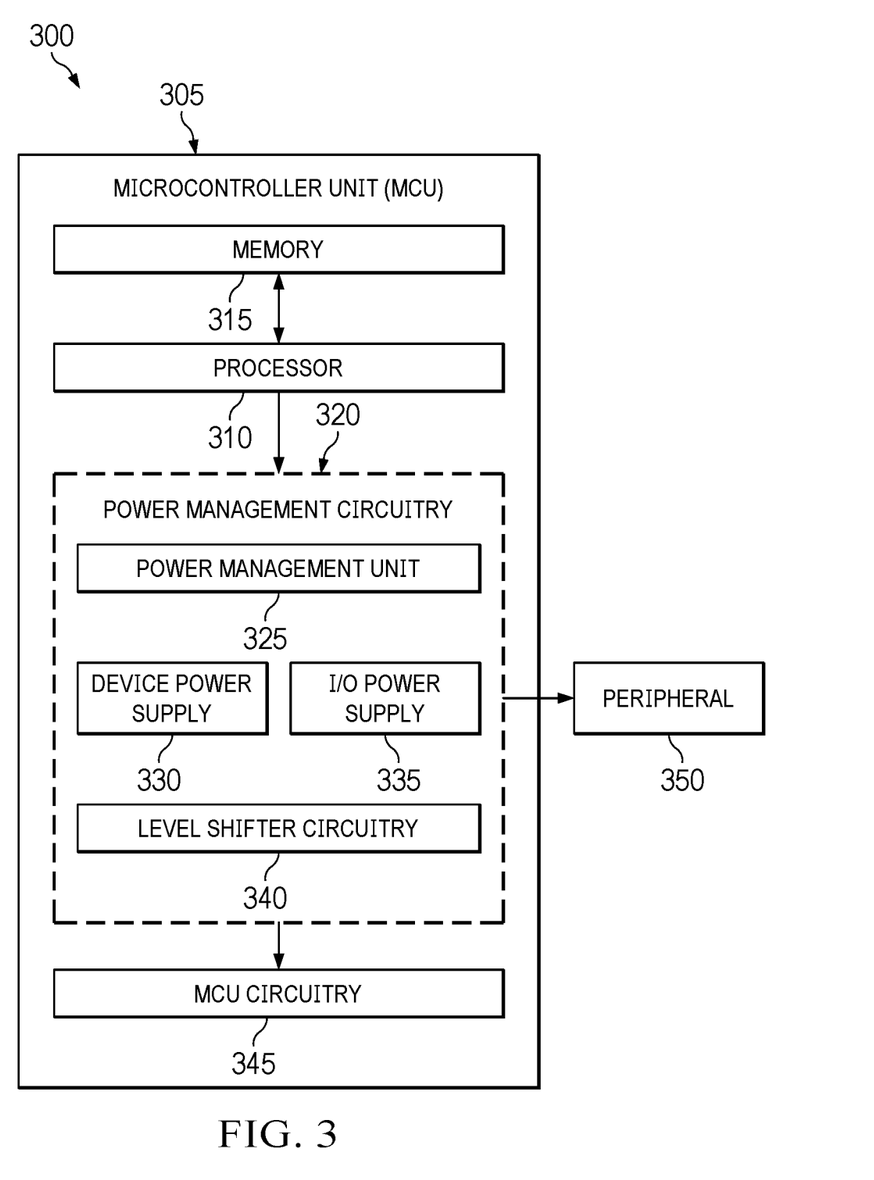
FIG. 3 illustrates an example block diagram of a system that uses power management circuitry in accordance with an embodiment.

In various examples, circuit architectures 101 and 102 may be embodied in circuitry utilized in an embedded system or system-on-chip (SoC), such as a microcontroller unit (MCU) (e.g., MCU 305 of FIG. 3). For example, elements internal to or external to power management circuitry (e.g., power management circuitry 320 of FIG. 3) may utilize circuit architectures 101 and 102 or components thereof.

Referring first to FIG. 1A, circuit architecture 101 includes inverter 110, which may be configured to couple to VDDS 105, level shifter 115, which may be configured to couple to VDDIO 106, and buffer 125, which may be coupled to inverter 110, level shifter 115, and VDDIO 106.

VDDS 105 is representative of a first power supply of a system (e.g., MCU 305) capable of providing a positive supply voltage to components of the system (e.g., MCU circuitry 345). VDDS 105 may be an internal power supply that can be ramped up (i.e., turned on, driven to reach a desired positive supply voltage) and ramped down (i.e., turned off to reach a supply voltage of 0 V) at different times based on signals provided by a power management unit (PMU) (e.g., PMU 325) of the system. The PMU may control the operations of VDDS 105 such that VDDS 105 can power certain components of the system at certain times via the positive supply voltage and conserve power at other times.

VDDIO 106 is representative of a second power supply of a system capable of providing a positive supply voltage to peripherals, internal to or external to, of the system. VDDIO 106 may be an additional internal power supply that can be coupled to peripherals of the system at input/output (I/O) pins or ports of the system. VDDIO 106 may be ramped up or ramped down independently of VDDS 105. Problematically, however, if VDDIO 106 ramps up before VDDS 105 ramps up, VDDIO 106 may provide erroneous signals to the peripherals without control of VDDIO 106. Therefore, circuit architecture 101 may be included in the system to provide split rail supply control of VDDIO 106.

In circuit architecture 101, VDDS 105 is configured to couple to inverter 110. Inverter 110 includes transistors 111 and 112 coupled to each other. Transistor 111 may be a p-channel (or p-type) metal-oxide semiconductor field-effect transistor (MOSFET) (also referred to as a PMOS transistor), and transistor 112 may be an n-channel (or n-type)

MOSFET (also referred to as an NMOS transistor). Transistors 111 and 112 each include a gate, a drain, and a source. VDDS 105 may be coupled to the source of transistor 111. The gates and the drains of transistors 111 and 112 may be coupled together. The source of transistor 112 may be coupled to ground connection 114 and further to level shifter 115 and buffer 125.

The gate of transistor 111 may be further coupled to receive enable 107. Enable 107 may be a signal provided by a processor, controller, or other processing device (e.g., processor 310) capable of controlling operations of inverter 110, and consequently, level shifter 115. Inverted enable 108 is a complement signal to enable 107, and can be measured at the drains of transistors 111 and 112. In other words, inverted enable 108 has a value opposite the value of enable 107. Based on the values of enable 107 and inverted enable 108, inverter 110 can output a signal (e.g., VSS 113) having a value to level shifter 115 and buffer 125.

Level shifter 115 is representative of a circuit capable of receiving a first signal at enable 107 that has a given logical state and a first voltage and producing a second signal at output 130 having the same logical state (or opposite state in some examples) and having a second voltage that may be different from the first voltage. In other words, given logical states of low, or "0", and high, or "1", for example, in a first voltage domain powered by a first power supply, logic high may be represented by 1.8 V, and in a second voltage domain powered by a second power supply, logic high may be represented by 3.3 V. Level shifter 115 may also be used in applications where logic high is represented by the same voltage (e.g., 3.3 V) in both voltage domains and signal isolation is desired.

Level shifter 115 includes a pair of cross-coupled PMOS transistors, transistors 116 and 118, a pair of NMOS transistors, transistors 117 and 119, and capacitor 120. Each of transistors 116, 117, 118, and 119 have a gate, a source, and a drain. The sources of transistors 116 and 118 are coupled to VDDIO 106, to buffer 125, and to each other. The gate of transistor 116 is coupled to the drain of transistor 118 and to the drain of transistor 119. The drain of transistor 116 is coupled to the gate of transistor 118, to the drain of transistor 117, and to a first terminal of capacitor 120. The drain of transistor 118 is coupled to an input of buffer 125 and to the drain of transistor 119. The sources of transistors 117 and 119 are coupled to inverter 110, to a second terminal of capacitor 120, to buffer 125, and to each other. The gate of transistor 117 is coupled to receive inverted enable 108, and the gate of transistor 119 is coupled to receive enable 107.

Buffer 125 is representative of a digital buffer device capable of isolating the input signal received from level shifter 115 from output 130. Output 130 may have a logical value, either a "0" or a "1" based on the values of enable 107 and inverted enable 108 as applied to inverter 110 and level shifter 115. In various examples, output 130 may be available at signal pads of VDDIO 106 for use by one or more peripherals or devices in or connected to the system.

In a first example, a circuitry of processor powered by VDDS 105 can provide an input signal at enable 107, having a high value, to inverter 110. Enable 107 may be high, or "1", and thus, inverted enable 108 may be low, or "0". Based on enable 107 being a high value, transistor 119 may turn on and conduct while transistor 117 may not conduct. When transistor 119 conducts, transistor 116 may be pulled open which may prevent transistor 118 from conducting based on the cross-coupling of transistors 116 and 118. Accordingly, the value at node 121 may be high, or "1". The value measured at node 122 may be the opposite of the value at node 121 due to the configuration of transistors in level shifter 115. Thus, the value at node 122 may be low, or "0". Buffer 125 can receive an input with a value of "0" as the input of buffer 125 is coupled at node 122, and thus, buffer 125 can produce output 130 with a value of "0" in the VDDIO 106 domain.

In a second example, the circuitry of the processor powered by VDDS 105 can provide an input signal at enable 107, having a low value, to inverter 110. Enable 107 may be low, or "1", and thus, inverted enable 108 may be high, or "1". Based on enable 107 being a low value, transistor 117 may receive the high value and turn on to conduct while transistor 119 may not conduct. When transistor 117 conducts, transistor 118 may be pulled open which may prevent transistor 116 from conducting based on the cross-coupling of transistors 116 and 118. Accordingly, the value at node 121 may be low, or "0". The value measured at node 122 may be the opposite of the value at node 121 due to the configuration of transistors in level shifter 115. Thus, the value at node 122 may be high, or "1". Buffer 125 can receive an input with a value of "1" as the input of buffer 125 is coupled at node 122, and thus, buffer 125 can produce output 130 with a value of "1" in the VDDIO 106 domain. Importantly, when VDDIO 106 ramps up before VDDS 105, circuit architecture 101 may be employed to produce output 130 having a stable, high value when enable 107 is low, which may prevent VDDIO 106 from providing unknown values to the peripherals without control via VDDS 105. The inclusion of capacitor 120 may cause the value at node 121 to be low, and consequently the value of 122 to be high, for a duration of time long enough for VDDS 105 and enable 107 to turn on to begin control over VDDIO 106.

In a third example, enable 107 and inverted enable 108 may be floating values. In other words, enable 107 and inverted enable 108 may have values somewhere in-between "0" and "1". Based on enable 107 and inverted enable 108 having non-zero values, both transistors 117 and 119 may partially conduct. Capacitor 120 may cause transistor 118 to conduct more than transistor 116. In this way, the value at node 122 may stabilize to a non-floating value. Thus, output 130 may be a non-floating value preventing VDDIO 106 from supplying floating values or unstable values to peripherals.

Referring next to FIG. 1B, FIG. 1B shows circuit architecture 102. Circuit architecture 102 includes the same elements as circuit architecture 101 and further includes clamp diodes 126 and 127.

Clamp diode 126 may be a diode-connected PMOS transistor, and clamp diode 127 may be a diode-connected NMOS transistor. The source and gate of clamp diode 126 may be coupled to VDDIO 106 and the sources of transistors 116 and 118. The drain of clamp diode 126 may be coupled to the drain of transistor 118, the gate of transistor 116, and the drain of transistor 119, or in other words, at node 122, feeding buffer 125. The source and gate of clamp diode 127 may be coupled to inverter 110, the sources of transistors 117 and 119, at capacitor 120, or in other words, to VSS 113. The drain of clamp diode 127 may be coupled to the drain of transistor 117 and to the first terminal of capacitor 120, or in other words, at node 121. During operations, clamp diodes 126 and 127 can protect buffer 125 from damaging signals flowing through the circuit.

Figure 2:
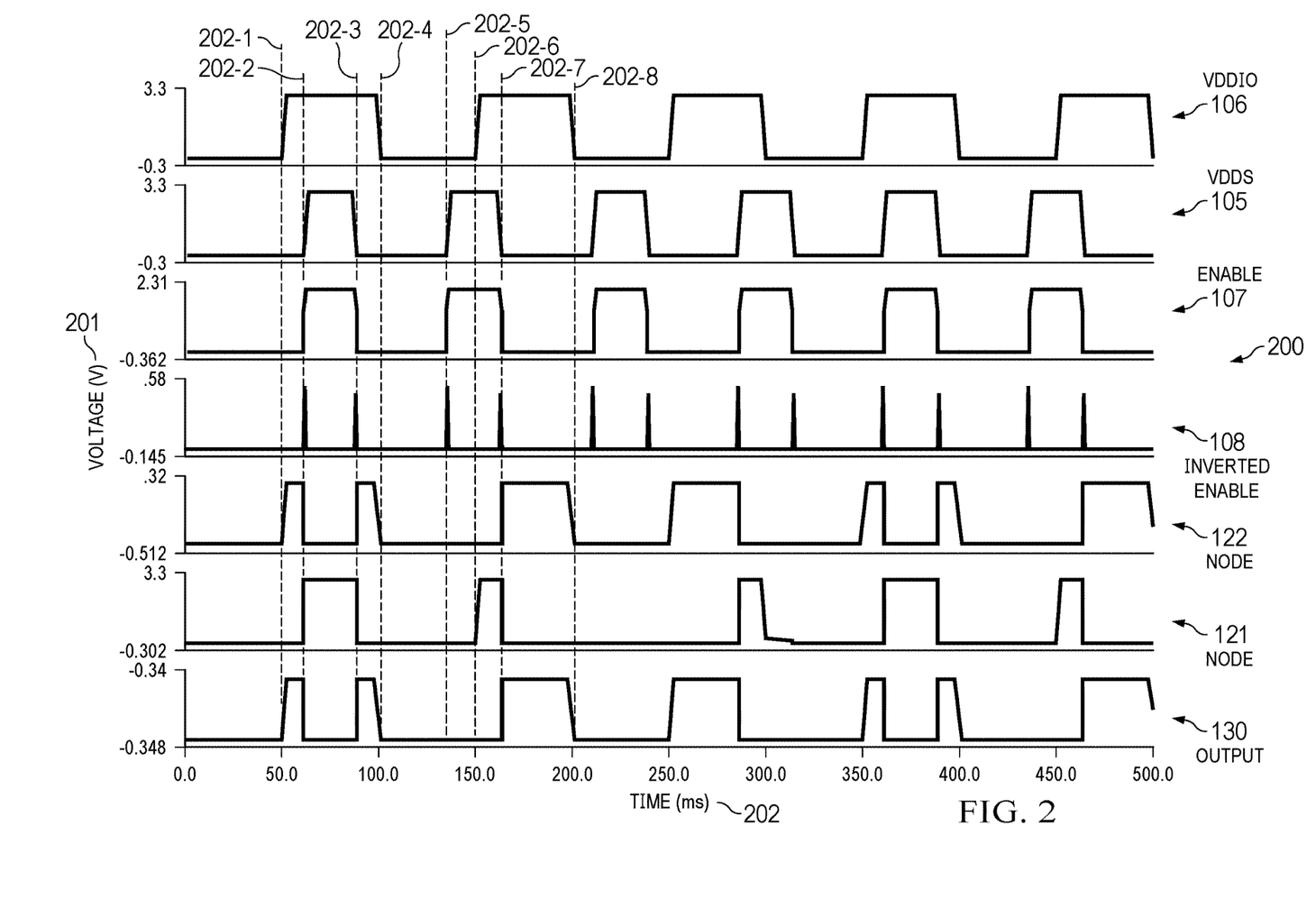
FIG. 2 illustrates example graphical representations of outputs of example power management circuitry in accordance with an embodiment.

FIG. 2 illustrates example graphical representations of signals of example power management circuitry measured at different times in accordance with an embodiment. FIG. 2 shows graphical representations 200, which references elements of FIGS. 1A and 1B that show sample values measured at nodes in circuit architectures 101 and 102, respectively, with respect to voltage 201 and time 202. More specifically, graphical representations 200 include waveforms showing values of VDDIO 106, VDDS 105, enable 107, inverted enable 108, node 122, node 121, and output 130 at times 202-1, 202-2, 202-3, 202-4, 202-5, 202-6, 202-7, and 202-8.

In various examples, times 202-1, 202-2, 202-3, 202-4, 202-5, 202-6, 202-7, and 202-8 represent chronological times wherein a system, including elements arranged via circuit architecture 101 or circuit architecture 102, is operating. The values shown in each waveform are high or low values. A "high" value may be the equivalent of a logical high state (e.g., "1"). A "low" value may be the equivalent of a logical low state (e.g., "0").

Time 202-1 represents a first time, during which, VDDIO 106 ramps up or turns on. At this time, VDDS 105 may not be on, and thus, has a low voltage 201. VDDIO 106 may ramp up when enable 107 is low (due to the circuitry that provides the signal at enable 107 being powered by VDDS 105, which is off) and inverted enable 108 is high. When VDDIO 106 ramps up before VDDS 105 ramps up, elements of circuit architecture 101 or 102 may be employed to prevent VDDIO 106 from providing erroneous signals to peripherals and devices coupled to VDDIO 106. More specifically, based on enable 107 being a low value and inverted enable 108 being a high value, transistor 117 may receive the high value (e.g., a positive voltage) and turn on to conduct while transistor 119 may not conduct. When transistor 117 conducts, transistor 118 may be pulled open which may prevent transistor 116 from conducting based on the cross-coupling of transistors 116 and 118. Accordingly, the value at node 121 may be low, or "0", at time 202-1. The value measured at node 122 may be the opposite of the value at node 121 due to the configuration of transistors in level shifter 115. Thus, the value at node 122 may be high at time 202-1. Buffer 125 can receive an input with a value of "1" as the input of buffer 125 is coupled at node 122, and thus, buffer 125 can produce output 130 with a high value at time 202-1. Circuitry coupled to output 130 may gate outputs of VDDIO 106 circuitry based on output 130 being high. The inclusion of capacitor 120 may cause the value at node 121 to be low, and consequently the value of 122 to be high, for a duration of time long enough (i.e., the time between time 202-1 and 202-2) for VDDS 105 and enable 107 to turn on to begin control over VDDIO 106 at time 202-2.

At time 202-2, VDDIO 106 remains on, and VDDS 105 turns on and begins to ramp up as enable 107 is at a high value. As enable 107 changes to a high value, inverted enable 108 changes to a low value. Based on enable 107 being a high value, transistor 119 may turn on and conduct while transistor 117 may not conduct. When transistor 119 conducts, transistor 116 may be pulled open which may prevent transistor 118 from conducting based on the cross-coupling of transistors 116 and 118. Accordingly, the value at node 121 may change from a low value to a high value. The value measured at node 122 may be the opposite of the value at node 121 due to the configuration of transistors in level shifter 115. Thus, the value at node 122 may change to a low value at time 202-2. Buffer 125 can receive an input with a value of "0" as the input of buffer 125 is coupled at node 122, and thus, buffer 125 can produce output 130 with a value of "0" at time 202-2 as control over VDDIO 106 may no longer be required when VDDS 105 is on. This may indicate a normal operating condition, and circuitry coupled to output 130 may respond normally to outputs of VDDIO 106 circuitry based on output 130 being low.

At time 202-3, VDDS 105 ramps down to a low value while VDDIO 106 remains on. Accordingly, enable 107 ramps down to a low value and inverted enable 108 ramps up to a high value. Similar to time 202-1, transistor 117 may turn on to conduct and transistor 119 can turn off. When transistor 117 conducts, transistor 118 may be pulled open which may prevent transistor 116 from conducting based on the cross-coupling of transistors 116 and 118. Accordingly, the value at node 121 may be low, or "0", at time 202-3. The value measured at node 122 may be the opposite of the value at node 121 due to the configuration of transistors in level shifter 115. Thus, the value at node 122 may return to a high value at time 202-3. Buffer 125 can receive an input with a value of "1" as the input of buffer 125 is coupled at node 122, and thus, buffer 125 can produce output 130 with a high value at time 202-3 to control VDDIO 106. The inclusion of capacitor 120 may cause the value at node 121 to be low, and consequently the value of 122 to be high, for a duration of time long enough (i.e., the time between time 202-3 and 202-4) for VDDS 105 and enable 107 to turn on to begin control over VDDIO 106 at time 202-3.

At time 202-4, VDDIO 106 ramps down to a low value. At this time, both VDDS 105 and VDDIO 106 are turned off, thus, no current may be flowing through the circuitry and to any peripherals or other devices. Thus, at time 202-4, all the waveforms may show low values as no transistors are conducting.

At time 202-5, enable 107 ramps up to a high value causing VDDS 105 to turn on and ramp up to a high value. At this time, VDDIO 106 remains off. Because VDDIO 106 is off, elements of circuit architecture 101 or 102 may not be required to control VDDIO 106, so output 130 may remain low.

At time 202-6, VDDS 105 remains on as enable 107 remains on, and VDDIO 106 begins to ramp up to a high value. Based on enable 107 being a high value when VDDIO 106 ramps up, transistor 119 may turn on and conduct while transistor 117 may not conduct. When transistor 119 conducts, transistor 116 may be pulled open which may prevent transistor 118 from conducting based on the cross-coupling of transistors 116 and 118. Accordingly, the value at node 121 may change from a low value to a high value. The value measured at node 122 may be the opposite of the value at node 121 due to the configuration of transistors in level shifter 115. Thus, the value at node 122 may change to a low value at time 202-5. Buffer 125 can receive an input with a value of "0" as the input of buffer 125 is coupled at node 122, and thus, buffer 125 can produce output 130 with a value of "0" at time 202-5 as control over VDDIO 106 may not be required when VDDS 105 is on.

At time 202-7, enable 107 may change from a high value to a low value, and thus, VDDS 105 may turn off. However, VDDIO 106 may remain on at time 202-7. Transistor 117 may turn on to conduct and transistor 119 can turn off. When transistor 117 conducts, transistor 118 may be pulled open which may prevent transistor 116 from conducting based on the cross-coupling of transistors 116 and 118. Accordingly, the value at node 121 may be low, or "0", at time 202-7. The value measured at node 122 may be the opposite of the value at node 121 due to the configuration of transistors in level shifter 115. Thus, the value at node 122 may return to a high value at time 202-7. Buffer 125 can receive an input with a value of "1" as the input of buffer 125 is coupled at node 122, and thus, buffer 125 can produce output 130 with a high value at time 202-3 to control VDDIO 106. The inclusion of capacitor 120 may cause the value at node 121 to be low, and consequently the value of 122 to be high, for a duration of time long enough (i.e., the time between time 202-3 and 202-4) for VDDS 105 and enable 107 to turn on to begin control over VDDIO 106 at time 202-7.

At time 202-8, enable 107 remains off, and consequently, so does VDDS 105, and VDDIO 106 ramps down to the low value. At this time, all of the transistors may stop conducting. Thus, node 122 returns to the low value as does output 130.

While only a few times are illustrated and described with respect to graphical representations 200, any combination or variation of ramping up and down of VDDS 105 and VDDIO 106 may be contemplated in any order. Importantly, however, when VDDIO 106 is on while VDDS 105 is off, the value at node 122 may be high for a time long enough to produce a high value at output 130 to control VDDIO 106 while VDDS 105 is off for that duration of time due to capacitor 120.

FIG. 3 illustrates an example block diagram of a system that uses power management circuitry in accordance with an embodiment. FIG. 3 includes block diagram 300, which includes microcontroller unit (MCU) 305, components thereof, and peripheral 350. MCU 305 further includes processor 310, memory 315, power management circuitry 320, and MCU circuitry 345. Power management circuitry 320 includes power management unit (PMU) 325, device power supply 330, input/output (I/O) power supply 335, and level shifter circuitry 340. In various examples, elements of power management circuitry 320 may employ split rail support techniques enabled by split rail power supply architecture, such as circuit architecture 101 of FIG. 1A or circuit architecture 102 of FIG. 1B.

MCU 305 is representative of an embedded system or system-on-chip capable of performing various functions via hardware, software, firmware, or combination or variation thereof. To perform functions, MCU 305 may include processor 310, memory 315, power management circuitry 320, and MCU circuitry 345.

Processor 310 is representative of one or more processor cores capable of executing software and firmware. Examples of such processor cores(s) may include DSPs, general purpose central processing units, application specific processors or circuits (e.g., ASICs), and logic devices (e.g., FPGAs), as well as any other type of processing device, combinations, or variations thereof. Processor 310 may be coupled to memory 315 from where it can execute software and firmware and power management circuitry 320.

Memory 315 may include any non-transitory, computer-readable storage media capable of being read from and written to by various components, such as processor 310 MCU circuitry 345, and peripheral 350, among other elements. In some embodiments, memory 315 may include volatile and nonvolatile, removable and non-removable media implemented in any method or technology for storage of information, such as computer readable instructions, data structures, program modules, or other data. Examples of storage media include random access memory, read only memory, magnetic disks, optical disks, optical media, flash memory, virtual memory and non-virtual memory, magnetic cassettes, magnetic tape, magnetic disk storage or other magnetic storage devices, or any other suitable storage media. Memory 315 may store data for use by processor 310, MCU circuitry 345, and peripheral 350.

Power management circuitry 320 is representative of components capable of providing power to components internal to MCU 305 (e.g., VDDS 105) and components external to peripheral 350 (e.g., VDDIO 106). Power management circuitry 320 includes PMU 325, device power supply 330, I/O power supply 335, and level shifter circuitry 340. Power management circuitry 320 may be coupled to receive signals from processor 310, such as initialization or enable signals, trim data, and the like, and coupled to provide power to MCU circuitry 345 and peripheral 350.

MCU circuitry 345 is representative of on-chip circuitry and hardware devices of MCU 305. MCU circuitry 345 may perform various functions for MCU 305 when driven by power supplied by device power supply 330. Examples of MCU circuitry 345 may include analog-to-digital converters, oscillators, logic devices, and the like.

PMU 325 is representative of one or more power management circuits capable of initializing device power supply 330 and I/O power supply 335. For example, PMU 325 may include a power-on-reset (POR) circuit, a brown-out detector circuit, and a bandgap reference circuit, among other circuits and hardware components. The elements of PMU 325 can be sequentially initialized to safely start-up device power supply 330 and I/O power supply 335.

Device power supply 330 is representative of a power supply of MCU 305 that can power various components, such as MCU circuitry 345, internal to MCU 305. For example, device power supply 330 may be exemplary of VDDS 105 of FIGS. 1A and 1B. I/O power supply 335 is representative of a power supply of MCU 305 that can power various other components, such as peripheral 350, internal to or external to MCU 305 that may be connected to I/O pins of MCU 305. For example, I/O power supply 330 may be exemplary of VDDIO 106 of FIGS. 1A and 1B.

In various examples, PMU 325 may be configured to control operations of device power supply 330. For example, PMU 325 can receive a signal from processor 310 to begin initialization of device power supply 330. This may entail ramping up reference circuitry and power-on reset circuitry to ensure that device power supply 330 produces a voltage necessary for desired operations. Device power supply 330 may be configured to control operations of I/O power supply 335. For example, device power supply 330 may include software and/or firmware that, when executed, ramps up I/O power supply 335 and ensures that I/O power supply 335 produces a stable voltage with a value appropriate for desired operations.

However, in some cases, I/O power supply 335 may turn on before device power supply 330. In such cases, level shifter circuitry 340 may be used to disable I/O power supply 335 or prevent I/O power supply 335 from providing voltage signals to peripheral 350 via I/O pins of MCU 305.

Level shifter circuitry 340 is representative of a circuit capable of receiving a first signal of a given logical state and a first voltage and producing a second signal having the same logical state (or opposite state in some examples) and having a second voltage that may be different from the first voltage. In various examples, several level shifter circuits may be used in MCU 305. However, at least one of the level shifter circuits may include components including and arranged as in circuit architecture 101 of FIG. 1A or circuit architecture 102 of FIG. 1B for the control of I/O power supply 335. The level shifter circuit having circuit architecture 101, for example, may be used in various scenarios. For example, the level shifter circuit can be used to prevent I/O power supply 335 from supplying an output voltage to peripheral 350 if device power supply 330 is not on. By way of another example, the level shifter circuit can be used to stabilize the output voltage of I/O power supply 335 when both device power supply 330 and I/O power supply 335 ramp up simultaneously. If, however, device power supply 330 ramps up before I/O power supply 335, level shifter circuitry 340 may not be required to change output values of I/O power supply 335.

After being safely ramped up, I/O power supply 335 may produce a supply voltage controlled by either device power supply 330 or level shifter circuitry 340 as mentioned. I/O power supply 335 can be coupled to peripheral 350 at I/O pins of MCU 305. Peripheral 350 is representative of a component, circuit, system, sub-circuit, sub-circuit, or the like capable of interfacing with MCU 305 and performing one or more functions. In various examples such as the one illustrated in FIG. 3, peripheral 350 is external to MCU 305, or located off-chip. However, in other examples, peripheral 350 may be located within MCU 305, or on-chip. Additional peripherals may also be included on-chip or off-chip and may each perform different functionality when driven by I/O power supply 335.

Figure 4:
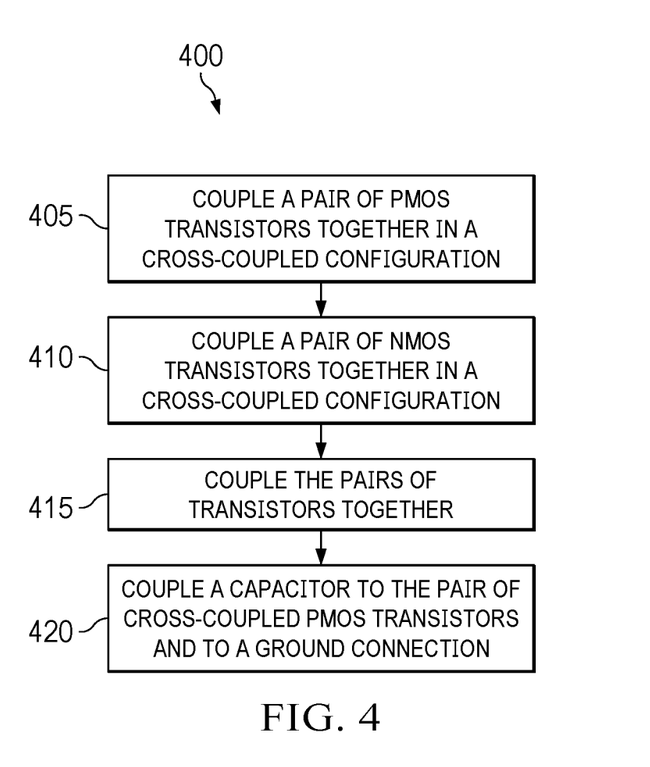
FIG. 4 illustrates an example series of steps of configuring components of power management circuitry in accordance with an embodiment.

FIG. 4 illustrates an example series of steps of configuring components of power management circuitry in accordance with an embodiment. FIG. 4 includes process 400, which references elements of FIGS. 1A and 1B. Process 400 may include steps for manufacturing, coupling, affixing, or otherwise connecting components of circuit architectures 101 or 102 together for use in a system, such as MCU 305 of FIG. 3.

In operation 405, a pair of PMOS transistors, such as transistors 116 and 118 can be coupled together in a cross-coupled configuration. Both transistors 116 and 118 have a gate, a source, and a drain. The sources of transistors 116 and 118 can be coupled together. The gate of transistor 116 can be coupled to the drain of transistor 118. The drain of transistor 116 can be coupled to the gate of transistor 118.

In operation 410, a pair of NMOS transistors can be coupled to the cross-coupled pair of PMOS transistors. More specifically, a first NMOS transistor, transistor 117, can be coupled to parts of transistors 116 and 118, and a second NMOS transistor, transistor 119 can be coupled to the parts of transistors 116 and 118. Like transistors 116 and 118, both transistors 117 and 119 have a gate, a drain, and a source. The drain of transistor 117 can be coupled to the drain of transistor 116. The drain of transistor 117 can further be coupled to the gate of transistor 118. The drain of transistor 119 can be coupled to the drain of transistor 118. The drain of transistor 119 can further be coupled to the gate of transistor 116. The sources of transistors 117 and 119 can be coupled together and coupled to a ground connection.

Next, in operation 415, capacitor 120 can be coupled to the pair of cross-coupled PMOS transistors 116 and 118, the NMOS transistors 117 and 119, and to the ground connection. More specifically, capacitor 120 can be coupled to the drains of transistors 116 and 117, to the gate of transistor 118, and to the sources of transistors 117 and 119.

In operation 420, level shifter 115, including transistors 116, 117, 118, and 119 and capacitor 120, can be coupled to inverter 110, VDDIO 106, and to buffer 125. Specifically, inverter 110 can be coupled to the sources of transistors 117 and 119 and to capacitor 120. VDDIO 106 can be coupled to the sources of transistors 116 and 118. Buffer 125 may be coupled to receive inputs from inverter 110, level shifter 115, and VDDIO 106. For example, buffer 125 may be coupled to inverter 110, the sources of transistors 117 and 119, and capacitor 120 at a first input. Buffer 125 may be coupled to level shifter 115 at the drain of transistor 118 at a second input. Buffer 125 may be coupled to VDDIO 106, and to the sources of transistors 116 and 118, at a third input.

In other examples, operations of process 400 may occur in various orders and may include additional or fewer connections. For example, additional transistors, such as clamp diodes 126 and 127 may be included and coupled to level shifter 115 and buffer 125.

While some examples provided herein are described in the context of a power management system, a level shifter circuit, an embedded system or system-on-chip, sub-circuit, system, subsystem, component, device, architecture, or environment, it should be understood that the circuits, devices, logic elements, and other components, systems, and methods described herein are not limited to such embodiments and may apply to a variety of other processes, systems, applications, devices, and the like, such as other circuits, logic devices, transistors, and the like, in the context of split rail power supply support, for example. Accordingly, aspects of the present invention may be embodied as other systems, methods, and other configurable systems.

Unless the context clearly requires otherwise, throughout the description and the claims, the words "comprise," "comprising." and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. An integrated circuit device, comprising:
   a device voltage supply;
   an input/output (I/O) voltage supply coupled to the device voltage supply; and
   a level shifter circuit coupled to the I/O voltage supply, wherein the level shifter circuit comprises:
      a pair of cross-coupled PMOS transistors;
      a pair of NMOS transistors coupled between the pair of cross-coupled PMOS transistors and a ground connection; and
      an inverter circuit coupled to the device voltage supply and the level shifter circuit; and
   wherein the level shifter circuit further comprises a capacitor coupled to the pair of cross-coupled PMOS transistors and the ground connection, and in parallel with respect to a first one of the pair of NMOS transistors.

2. The integrated circuit device of claim 1, wherein the pair of NMOS transistors comprises a first NMOS transistor and a second NMOS transistor, wherein a source of each of the pair of NMOS transistors is coupled to the ground connection, and wherein a drain of each of the pair of NMOS transistors is coupled to the pair of PMOS transistors.

3. The integrated circuit device of claim 2, wherein the pair of cross-coupled PMOS transistors comprises a first PMOS transistor and a second PMOS transistor, and wherein the capacitor is connected to a drain of the first PMOS transistor and a gate of the second PMOS transistor.

4. The integrated circuit device of claim 3, further comprising a buffer coupled to the level shifter circuit and the ground connection, wherein the buffer comprises an input node connected to a gate of the first PMOS transistor and a drain of the second PMOS transistor.

5. The integrated circuit device of claim 4, wherein the drain of the first NMOS transistor is connected to the drain of the first PMOS transistor, the gate of the second PMOS transistor, and the capacitor, and wherein the drain of the second NMOS transistor is connected to the gate of the first PMOS transistor, the drain of the second PMOS transistor, and the input node of the buffer.

6. The integrated circuit device of claim 5, wherein the inverter circuit comprises a third PMOS transistor coupled in series with a third NMOS transistor, wherein a source of the third PMOS transistor is connected to the device voltage supply, wherein a source of the third NMOS transistor is coupled with the ground connection, wherein a drain of the third PMOS transistor is connected to a drain of the third NMOS transistor.

7. The integrated circuit device of claim 6, wherein each gate of the third PMOS transistor and the third NMOS transistor is coupled with a gate of the second NMOS transistor, and wherein the drain of the third PMOS transistor the drain of the third NMOS transistor are each connected to a gate of the first NMOS transistor.

8. A level shifter circuit, comprising:
   an input;
   a first transistor coupled between a first power supply node and a first node, wherein the first transistor includes a gate coupled to the input;
   a second transistor coupled between the first node and a ground node, wherein the second transistor includes a gate coupled to the input;
   a third transistor coupled between a second power supply node and a second node, wherein the third transistor include a gate coupled to a third node;
   a fourth transistor coupled between the second node and the ground node, wherein the fourth transistor includes a gate coupled to the first node;
   a capacitor coupled between the second node and the ground node;
   a fifth transistor coupled between the second power supply node and the third node, wherein the fifth transistor includes a gate coupled to the second node; and
   a sixth transistor coupled between the third node and the ground node, wherein the sixth transistor includes a gate coupled to the input.

9. The level shifter circuit of claim 8, further comprising a seventh transistor coupled between the second power supply node and the third node, wherein the seventh transistor includes a gate coupled to the second power supply node.

10. The level shifter circuit of claim 9, further comprising an eighth transistor coupled between the second node and the ground node, wherein the eighth transistor includes a gate coupled to the ground node.

11. The level shifter circuit of claim 10, wherein the seventh transistor and the eighth transistor are diode-connected transistors.

12. The level shifter circuit of claim 8, further comprising a buffer comprising a first input, a second input, and a third input, wherein the first input is coupled to the second power supply node, the second input is coupled to the third node, and the third input is coupled to the ground node.

13. The level shifter circuit of claim 10, wherein the first transistor, the third transistor, the fifth transistor, and the seventh transistor are PMOS transistors.

14. The level shifter circuit of claim 10, wherein the second transistor, the fourth transistor, the sixth transistor, and the eighth transistor are NMOS transistors.

15. A system, comprising:
a processor;
a memory coupled to the processor; and
power management circuitry coupled to the processor and comprising:
  a first voltage supply;
  a second voltage supply coupled to the first voltage supply; and
  a level shifter circuit coupled to the second voltage supply, wherein the level shifter circuit comprises:
    a pair of cross-coupled PMOS transistors;
    a pair of NMOS transistors coupled between the pair of cross-coupled PMOS transistors and a ground connection; and
    an inverter circuit coupled to the first voltage supply and the level shifter circuit; and
  wherein the level shifter circuit further comprises a capacitor connected to the pair of cross-coupled PMOS transistors and the ground connection, and in parallel with respect to a first one of the pair of NMOS transistors.

16. The system of claim 15, wherein the pair of NMOS transistors comprises a first NMOS transistor and a second NMOS transistor, wherein a source of each of the pair of NMOS transistors is coupled to the ground connection, wherein a drain of each of the pair of NMOS transistors is coupled to the pair of PMOS transistors, wherein the pair of cross-coupled PMOS transistors comprises a first PMOS transistor and a second PMOS transistor, and wherein the capacitor is connected to a drain of the first PMOS transistor and a gate of the second PMOS transistor.

17. The system of claim 16, further comprising a buffer coupled to the level shifter circuit and the ground connection, wherein the buffer comprises an input node connected to a gate of the first PMOS transistor and a drain of the second PMOS transistor.

18. The system of claim 17, wherein the drain of the first NMOS transistor is connected to the drain of the first PMOS transistor, the gate of the second PMOS transistor, and the capacitor, and wherein the drain of the second NMOS transistor is connected to the gate of the first PMOS transistor, the drain of the second PMOS transistor, and the input node of the buffer.

19. The system of claim 18, wherein the inverter circuit comprises a third PMOS transistor coupled in series with a third NMOS transistor, wherein a source of the third PMOS transistor is connected to the first voltage supply, wherein a source of the third NMOS transistor is coupled with the ground connection, and wherein a drain of the third PMOS transistor is connected to a drain of the third NMOS transistor.

20. The system of claim 19, wherein each gate of the third PMOS transistor and the third NMOS transistor is coupled with a gate of the second NMOS transistor, and wherein the drain of the third PMOS transistor the drain of the third NMOS transistor are each connected to a gate of the first NMOS transistor.

* * * * *